United States Patent [19]

Ta

[11] Patent Number: 5,070,307

[45] Date of Patent: Dec. 3, 1991

[54] DIFFERENTIAL AMPLIFIER WITH ENHANCED SLEW RATE

[75] Inventor: Paul D. Ta, San Jose, Calif.

[73] Assignee: VLSI Technology, Inc., San Jose, Calif.

[21] Appl. No.: 631,620

[22] Filed: Dec. 21, 1990

[51] Int. Cl.[5] .............................................. H03F 3/45
[52] U.S. Cl. .................................... 330/253; 330/257; 330/261
[58] Field of Search ................ 330/252, 253, 257, 261, 330/277, 288, 296

[56] References Cited

U.S. PATENT DOCUMENTS 4,959,621 9/1990 Hosticka et al. .................... 330/253

Primary Examiner—Steven Mottola
Attorney, Agent, or Firm—Clifton L. Anderson

[57] ABSTRACT

A receiver is configured as a multistage differential amplifier. A front differential transconductance amplifier provides complementary outputs which respectively control current sources for an intermediate differential amplifier and a final differential amplifier. The output of the intermediate differential amplifier controls the mirror-current load of the final differential amplifier. The final current source and the final mirror-current load are controlled so that they induce a push-pull effect on the current output. When a high output is required, the output current is increased to charge the output capacitance more quickly. When a low output is required, the augmented current source drains the output capacitance more quickly. The net result is an enhanced slew rate for the receiver. The receiver can thus operate at higher frequencies and handle greater information rates.

8 Claims, 3 Drawing Sheets

DIFFERENTIAL AMPLIFIER WITH ENHANCED SLEW RATE

BACKGROUND OF THE INVENTION

The present invention relates to electronic circuits and, more particularly, to differential amplifiers. A major objective of the present invention is to provide a differential amplifier system that can respond rapidly to changes of differential input signals to accommodate high information transfer rates.

Societal operation and progress is propelled by the propagation of information. Information can be transferred through a variety of media, including air, electrical conductors, optical fibers, etc. Typically, demands for access to communication pathways soon exceed capacity. Thus, there is a strong incentive to maximize the rate at which information can be transmitted along a communication pathway.

The maximum information rate is generally constrained by the highest frequency that can be handled by a communication system. Information transmitted at a rate above this highest frequency will be lost. Therefore, information transmission is limited to rates low enough to substantially avoid such information loss. Providing for higher communication rates then requires a system with a greater maximum operating frequency.

One of the most pervasive approaches to communications is the transmission of information encoded as a time-varying voltage along an electrical conductor. Electrical communication systems are subject to information loss due to voltage signal attenuation and distortion. Attenuation is a result, at least in part, of electrical impedances associated with the conductor. These impedance include termination resistances used to avoid signal reflections due to impedance mismatches and the distributed capacitance between the conductor and ground. Distortion can be the result of ambient electric fields that bias the voltage waveform being transmitted.

Distortion can be addressed to a significant extent by using balanced-line communication systems. A balanced-line communication includes a transmitter with complementary outputs, a pair of transmission lines to convey respective ones of the complementary outputs, and a receiver. The receiver typically includes a differential amplifier to convert attenuated complementary waveforms into a regenerated waveform or a regenerated pair of complementary waveforms. The output of the differential amplifier reflects the difference in the complementary inputs. Any biases applied in common to both of the balanced lines is thereby cancelled. Such balanced line systems are often employed, for example, to communicate digital data in local area networks.

The response of the differential amplifier to changes in its inputs is not instantaneous. The response time depends on the magnitude of the differential driving the receiver, the speed of a differential amplifier's active elements as well as the size of the load to be driven by the amplifier. If the inputs change a second time before the output has properly represented the first change, information is lost. Thus, the communication rate must be maintained at or below the inverse of the transition time so that each signal transition can be responded to properly by the receiver.

Higher communication rates are potentially attainable using greater driving voltage differentials, but only at the risk of impedance mismatches. The impedance mismatches causes signal reflections that can interfere with the intended transmission. Higher communication rates can be accommodated by using faster active elements and larger bias currents, which provide for higher output slew-rates and thus faster transitions. However, there is still a demand for higher communication rates at any given level of component speed and power availability.

What is needed is an economical high-performance receiver for balanced-line communication systems. In other words, an approach is required that improves slew rate for a given driving voltage differential, given active element speeds, and given power specifications so as to provide for higher frequency operation and greater information communication rates.

SUMMARY OF THE INVENTION

In accordance with the present invention, a multistage differential amplifier system employs a push-pull effect to enhance the system slew rate. More specifically, the source and/or load currents of the final stage of the system are controlled, preferably in complementary fashion, to enhance the charging and discharging of output capacitance. This more rapid quenching of output capacitance increases the slew rate, providing for higher communications rates.

The final stage of the multi-stage system is a differential amplifier with a mirror-current load and a controlled current source. It has a pair of signal inputs arranged to respectively receive the system inputs. The prior stages of the system control the current source and the mirror-current load to increase the rate of charging and discharging of system output capacitance. Specifically, during a positive-going transition, the output capacitance can be charged more quickly by increasing the current from the mirror-current load; the increased mirror current is available to charge the output capacitance. During a negative-going transistion, the output capacitance can be discharged more quickly by increasing the current through the current source. The increased source current draws more discharge current from the output capacitance.

The control means for the final differential amplifier is preferably a pair of amplifiers, including a front transconductance amplifier and an intermediate differential amplifier. Like the final amplifier, each of the front and intermediate amplifiers includes a load, an input section and a current source. The stages in this system are control stages rather than progressive amplification. The front, intermediate and final amplifiers all receive unamplified differential inputs. The final amplifier is controlled by the front and intermediate amplifier, while the intermediate amplifier is controlled by the front amplifier.

More specifically, the output of the intermediate amplifier controls the mirror-current load of the final amplifier, while the front amplifier controls the current sources of the intermediate and final amplifier. The current sources are controlled so that they change in response to the system input differential. In response to complementary inputs, the final and intermediate current sources change in opposite directions. The complementary changes in current sources can be effected by coupling the final and intermediate current sources to respectively ones of complementary outputs of the front amplifier.

The current load section of the front differential amplifier can be coupled to the intermediate and final differential amplifiers in a mirror current arrangement. In other words, the source current of the final differential amplifier mirrors one of a pair of front-differential-amplifier load currents, while the source current of the intermediate differential amplifier mirrors the other front-differential-amplifier load current. The invention provides for the case where the mirror currents are equal to the front-differential-amplifier output currents, which serve as reference currents. However, a greater enhancement can be achieved by employing a proportionate mirror current relationship, where the ratio of mirror current changes is greater than one. In practice, this current gain is limited to about three.

In the case where the system output has the same sense as a first input signal and the opposite sense as a second input signal, the operation of the system is as follows. During a positive input transition, the output of the intermediate differential amplifier causes the load currents of the final stage to increase. This effect is enhanced by the increase in the source current of the intermediate differential amplifier. At the same time, the final-stage source current is decreased, limiting capacitance discharge.

During a negative-going transition, the source current of the final-stage is increased so as to facilitate output capacitance discharge. At the same time, the intermediate amplifier acts to decrease the final-stage load currents. This decrease is reinforced by the concomitant decrease in intermediate-stage source current. Thus, output capacitance is charged more quickly when a high output voltage is required, and is discharged more quickly when a low output voltage is required.

In a conventional differential amplifier, the source current and load of the final stage are not controlled so that charging and discharging of the output capacitance are not facilitated. By facilitating this charging and discharging, the present invention provides for greater slew rates.

Accordingly, the control signal applied to the final mirror-current load and the signal applied from the front differential amplifier to activate the final controlled-current source, act together to yield the push-pull effect on the amplifier system output. This pull-push minimizes the maximum transition time at the output of the differential amplifier system. The lower maximum output transition time provides for higher-frequency operation and enhanced communication rates. Moreover, the intermediate amplifier and the final amplifier can have the same electric circuit arrangement so that the fabrication of the differential amplifier system can be simplified while maintaining high temperature stability. These and other features and advantages of the present invention are apparent from the description below with reference to the following drawings.

BRIEF DESCRIPTION OF THE DRAWING

In FIGS. 2, and 3, transistors are identified with reference alphanumerics beginning with Q. The magnitude of currents through transistors having reference alphanumerics preceded by a prefix "+" vary in concert with the voltage of system output signal Z. The magnitude of currents through transistors having reference alphanumerics preceded by a prefix "−" vary in opposition to the voltage of system output signal Z. Nodes are identified with reference alphanumerics beginning with N. Voltages at nodes having reference alphanumerics preceded by a prefix "+" vary in concert with the voltage of system output signal Z. Voltages at nodes having reference alphanumerics preceded by a prefix "−" vary in opposition to the voltage of system output signal Z.

DESCRIPTION OF THE PREFERRED EMBODIMENT

Figure 1:
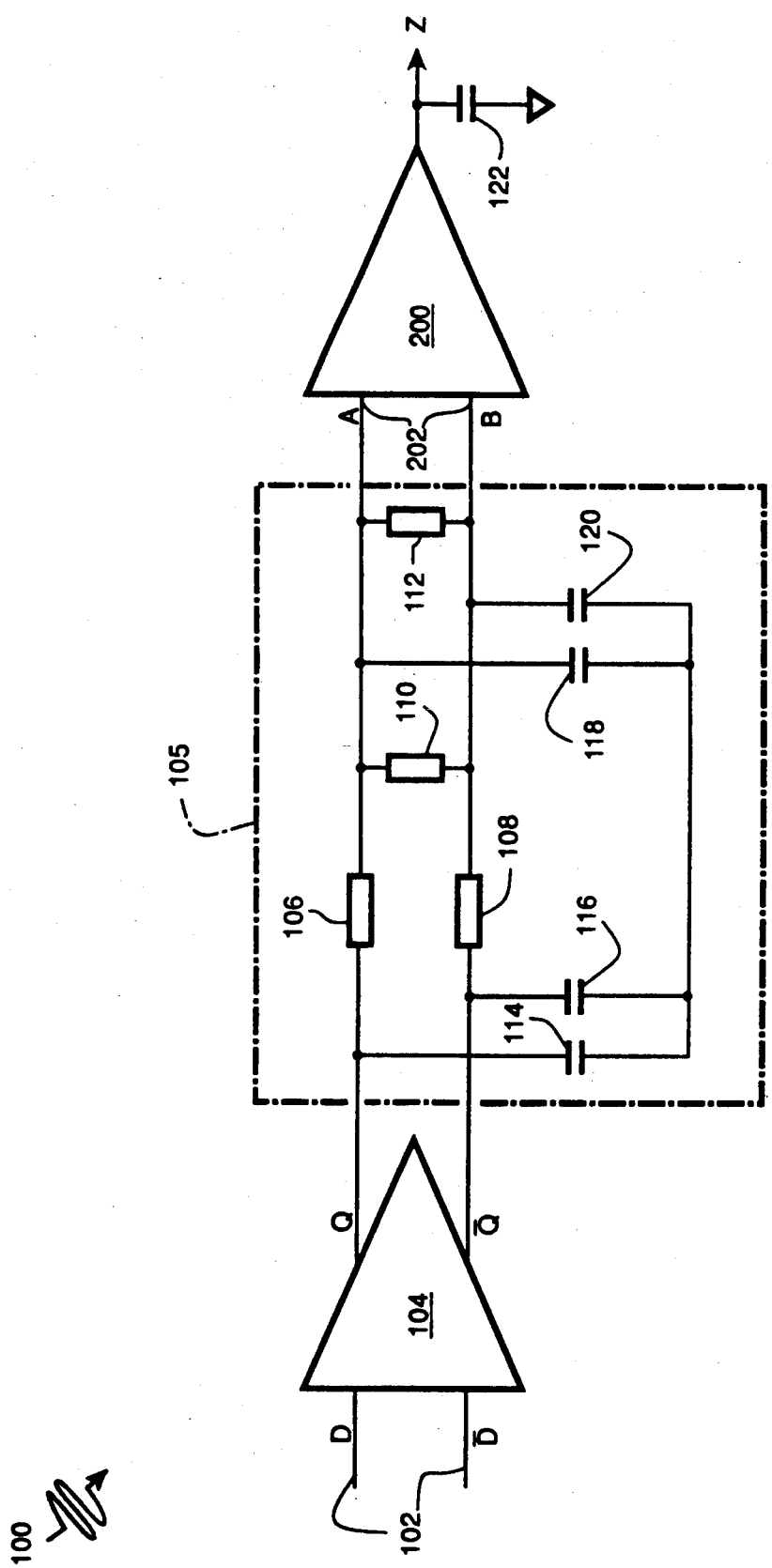
FIG. 1 is a block diagram of a communication system including a differential amplifier system in accordance with the present invention.

A communication system 100 includes a transmitter 104 and a receiver 200 as shown in FIG. 1. Communication system 100 is designed to operate at high frequency, for example, at the standard SONET (Synchronous Optical NETwork) rates of 52 megahertz (MHz) and 156 MHz. Transmitter 104 serves as a driver for typically complementary input signals D and $\bar{D}$ at transmitter inputs 102, yielding complementary output signals Q and $\bar{Q}$. Transmitter 104 is coupled to receiver 200 by a balanced transmission line 105.

Ideally, Q and $\bar{Q}$ would be the inputs to receiver 200. In practice, Q and $\bar{Q}$ are attenuated, particularly due to the terminated impedance in transmission line 105. This impedance is represented by resistances 106, 108, 110 and 112, and equivalent capacitances 114, 116, 118, and 120. The impedance of transmission line 105 can result in reducing a transmitted voltage differential of 5.0 volts to a received differential of about 400 millivolts (mV). Attenuated Q and $\bar{Q}$ signals are received as signals A and B at inputs 202 of receiver 200.

Since receiver 200 operates differentially, it cancels distortions common to signals A and B. Additional, receiver 200 acts as a driver for the difference of signals A and B. Receiver 200 provides a single-ended output signal Z which has the same sense as input signal A. The output capacitance of differential amplifier system 200 is represented by an equivalent capacitor 122. This output capacitance 122 limits the slew-rate of differential amplifier system 200.

Figure 2:
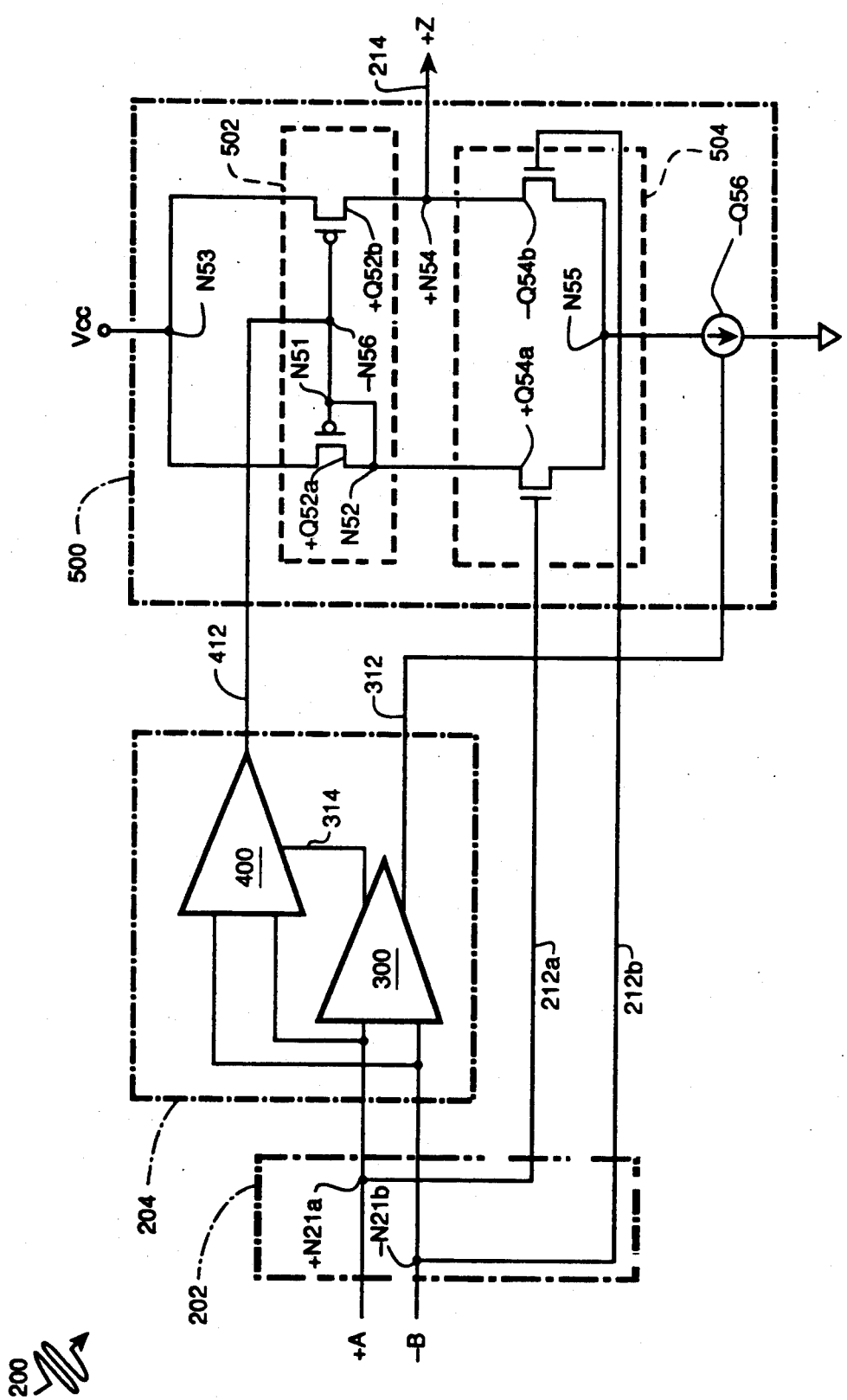
FIG. 2 is a schematic of the differential amplifier system of FIG. 1.

In accordance with the present invention, receiver 200 is a multistage differential amplifier system, as shown in FIG. 2. Receiver 200 comprises system input section 202, control section 204, and a final differential amplifier 500. System input section 202 includes system input nodes N21a and N21b for respectively receiving signals A and B. Both final differential amplifier 500 and control section 204 are coupled to system input section 202 for receiving signal A and B.

Differential amplifier 500 comprises a final load section 502, a final input section 504, and a final current source Q56. "Final" herein refers to components associated with the third and final stage of multistage differential amplifier system 200. Similarly, first stage components are referred to as "front" and second stage components are referred to as "intermediate".

Final input section 504 includes two n-channel MOS-FETs, Q54a and Q54b. The gate of Q54a is coupled to node N21a via line 212a of system input section 202 for receiving signal A therefrom; the gate of Q54b is coupled to node N21b via line 212b of system input section 202 for receiving signal B therefrom. Thus, the currents through transistors Q54a and Q54b vary in concert with respective system input signals A and B. "Vary in concert" refers to values which change in the same direction; "vary in opposition" is the opposite relationship. Positive current flow is taken to be from Vcc to ground.

Final load section 502 includes two p-channel MOSFETs, Q52a and Q52b. The gates of transistors Q52a and Q52b are coupled to each other and, via nodes N51 and N52, to the drain of transistor Q52a. This configuration defines a mirror-current relationship so that the "mirror" current through Q52b is equal to the "reference" current through Q52a. The sources of load transistors Q52a and Q52b are tied to VCC via node N53. The drain of Q52a is tied to the drain of Q54a via node N52, and the drain of Q52b is tied to the drain of Q54b via system output node N54, which defines the output voltage for the output signal Z. The sources of transistors Q54a and Q54b of final input section 504 are both coupled to current source Q56 via node N55.

In accordance with the present invention, load section 502 and current source Q56 are varied as a function of the system input differential A−B. Current source Q56 has a control input coupled via line 312 to control section 204, which causes the current through Q56 to vary in opposition to the desired output Z. Load 502 is also coupled, via a node N56 and line 412, to control section 204, which causes the currents through Q52a and Q52b to vary in concert with the desired output Z.

When A increases relative to B, a greater fraction of the source current flows through Q54a and a lesser fraction of the source current flows through Q54b. As in a conventional differential amplifier, the effect is to raise the voltage at output node N54 and divert some load current to the system output to charge the output capacitance. Concomitantly, control section 204 causes the source current to decrease, so that even less current flows through Q54b than would flow in the absence of control. This diverts an even greater fraction of the mirror load current out the output, so the output capacitance is charged more quickly than without current source control. Additionally, control section 204 causes the load currents to increase by lowering the voltage at node N56. This increase in load mirror current augments the current diverted to the system output, further increasing the rate at which the system output capacitance is quenched. This more rapidly quenching results in a reduced transition time during positive transitions in the input signal differential.

When B increases relative to A, a greater fraction of the source current flows through Q54b. Control section 204 causes the source current through Q56 to increase and the load current through Q52b to decrease. The result is an enhanced discharge current from the system output capacitance through input transistor Q54b and current source Q56. This amounts to a reduced transition time during negative transitions in the input signal differential. Thus, the present invention provides receiver 200 with a more favorable transistion time in response to both positive and negative input differential transitions.

Figure 3:
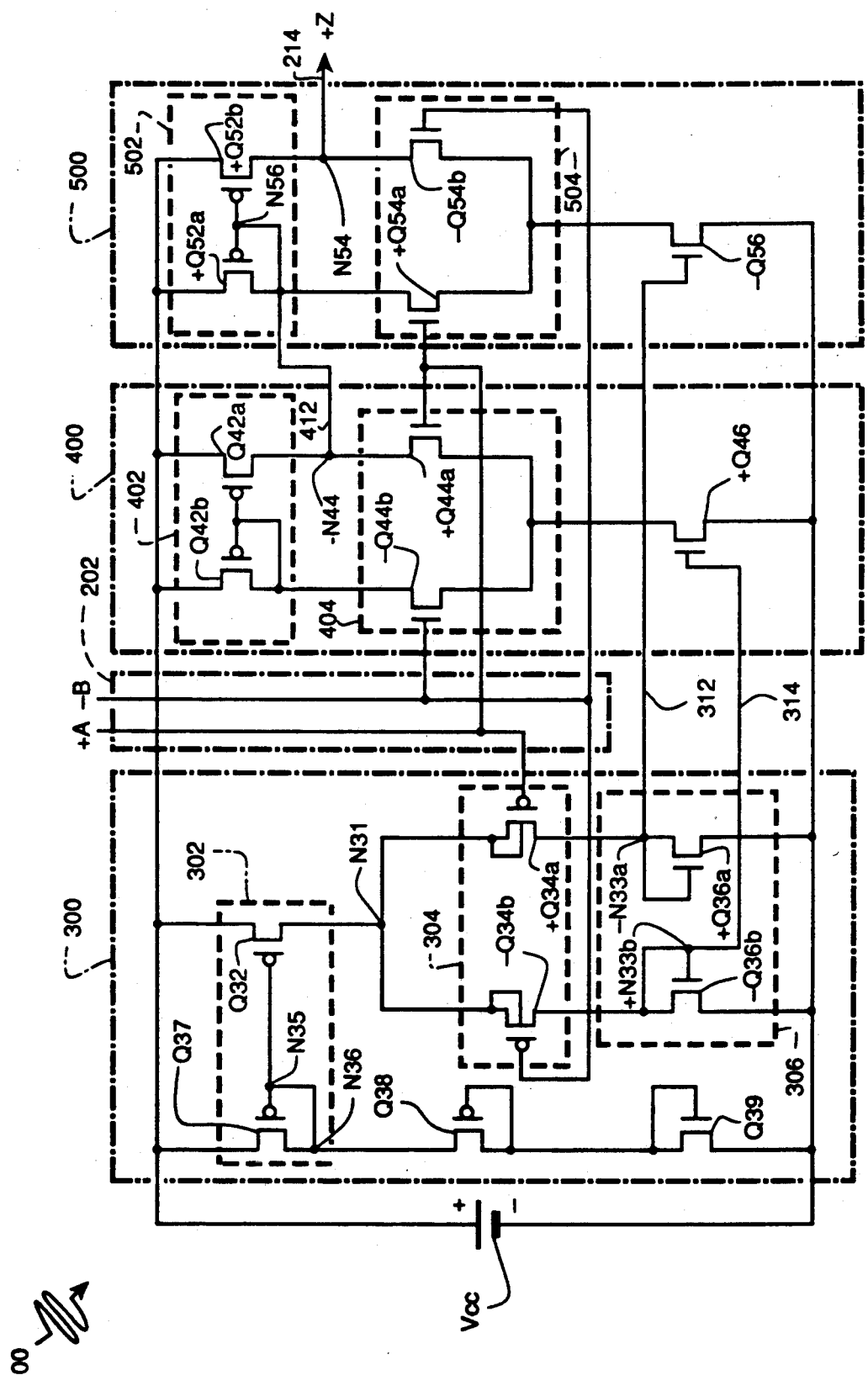
FIG. 3 is a more detailed schematic of the differential amplifier system of FIG. 2.

As shown in FIG. 2, control section 204 includes two differential amplifiers, a front amplifier 300 and an intermediate amplifier 400. Each is coupled to system input section 202 for receiving signals A and B. Amplifier 300 provides the output along line 312 that controls current source Q56, while amplifier 400 provides the output along line 412 that controls load 502. In accordance with the present invention, the output of amplifier 400 is augmented by further control by amplifier 300 via line 314. The relationship between amplifiers 300 and 400 is explained in greater detail below with reference to FIG. 3.

Front amplifier 300 is a differential transconductance amplifier. It includes a current source Q32, an input section 304, and a current load section 306. Current load section 306 includes load transistors Q36a and Q36b. Amplifier 300 includes current bias section constituted by transistors Q37, Q38, and Q39, which set up a basis current of 50 microamperes ($\mu$a). The gate of Q32 is tied to the gate and drain of bias transistor Q37, which causes Q32 to serve as a constant mirror-current source.

The constant source current through Q32 is divided between input transistors Q34a and Q34b according to the relative values of their respective inputs, i.e., signals A and B. The change in the current through Q34a is $(A-B)(g_{m34})$, and the change in the current through Q34b is $(B-A)(g_{m34})$, where $(g_{m34})$ is the transconductance shared by matched front input transistors Q34a and Q34b. The load currents through Q34a and Q34b necessarily flow through load transistors Q36a and Q36b, respectively. Node N33a is equipotential with the gate and drain of front source transistor Q36a, while node 34b is equipotential with the gate and drain of front source transistor Q36b. Thus, nodes N33a and N33b represent complementary voltage outputs of amplifier 300.

Intermediate amplifier 400 is essentially matched with final amplifier 500. Corresponding components have substantially equal specifications. The basic difference between the amplifiers is that intermediate amplifier 400 has a mirror-current load 402, while final amplifier 500 has controlled mirror-current load 502. Intermediate mirror-current load 402 comprises a reference current transistor Q42b and a mirror-current transistor Q42a. Intermediate amplifier 400 has an intermediate input section 404 comprising input transistors Q44a and Q44b coupled to system input section 202 for respectively receiving signals A and B. The current source Q46 of amplifier 400 is controlled as described below. An output node N44 is equipotential with final load control node N56 to which is it coupled via line 412.

When the input differential A−B increases, the current through input transistor Q44a increases and the voltage at intermediate output node N44 decreases. The voltage at node N56 also decreases, increasing the current through final load transistor Q52b, further increasing the current output via system output 214 as required to facilitate quenching of output capacitance to more rapidly attain an increased output voltage level.

Variation of the final source current in opposition to changes in input differential A−B is effected by the coupling of the gate of Q56 to node N33a. In addition, the gate of intermediate current source Q46 is coupled to first amplifier output node N33b so that the intermediate source current varies in concert with input differential A−B. Thus, the intermediate and final source currents tend to vary in opposition to each other.

The common transconductance ($g_{m46}$), of current sources Q46 and Q56 is about twice the common transconductance ($g_{m36}$), of front load transistors Q36a and Q36b. The couplings, via lines 314 and 312, of transistor Q36b to Q46 and Q36a to Q56 constitute current mirror couplings. The currents through Q36a and Q36b serve as reference currents, and the currents through Q56 and Q46 are respective mirror currents. However, due to the different transistor specifications, these mirror current variations are twice the reference current variations, as determined by the transconductance ratio $(g_{m46})/(g_{m36})$. Thus, the intermediate and final source currents are in a proportionate mirror current relationship with the load currents through transistors Q36b and Q36a, respectively. In other words, the current paths through intermediate and final source transistors Q46 and Q56 are respectively coupled to the currents paths through front load transistors Q36b and Q36a through a current amplifier arrangement.

In the event of a positive change in system input differential A−B, the intermediate source current through Q46 increases. This augments the already relatively large current through input transistor Q44a, further diminishing the voltage at intermediate output node N44, and final load control input node N56. This results in a further increase in the final reference current, and concomitantly in the final mirror load current, further facilitating quenching of output capacitance.

Thus, in receiver 200 there are three enhancements to the conventional effect of input differential A−B on the output capacitance. The first enhancement is due to the control of final current source Q56. The second is due to the effect of intermediate amplifier 400 on final load 502. The third is a further enhancement of the second enhancement due to control of intermediate current source Q46. Alternative embodiments employ a subset of these three enhancements. In some embodiments of the present invention, only the final source current is controlled. In other embodiments, only the final load current is controlled.

The present invention improves transition rate by increasing $I_{bias}$ as the the input differential increases. If A−B is positive, the intermediate source current increases by $(A-B)(g_{m34})(g_{m46})/(g_{m36})$ so as to facilitate charging of output capacitance. If A−B is negative, the final source current increases by the same amount to facilitate output capacitance discharge.

While the described embodiments are intended for digital communications, the present invention also provides for enhanced performance in analog communication systems as well. The present invention provides an enhanced slew rate when large swings in the output voltage are called for. Thus, the present invention diminishes the maximum transistion time characterizing an analog receiver. As a result, the analog receiver can handle higher frequencies.

Different component specifications, including different transconductance amplifier gains and mirror current proportionalities are provided for. For example, various embodiments employ mirror proportionality ratios of 1.0 to 3.0 between the final and intermediate source currents on the one hand and the front load currents on the other. One embodiment employs a non-differential amplifier as the intermediate amplifier. Another embodiment couples one of its complementary outputs of the front amplifier directly to the load control input of the final amplifier. Embodiments vary in the bias level established. Different embodiments employ different types of transistors, loads and sources. These and other variations upon and modifications to the disclosed embodiments are provided for by the present invention, the scope of which is limited only by the following claims.

What is claimed is:

1. A differential amplifier system comprising:
   system input means for receiving a first system input signal and a second system input signal;
   a final amplifier providing a system output, said final amplifier including
   a controlled final current source for providing a final source current having a final source-current magnitude, said final current source having a final current-source control input so that said final source-current magnitude can be varied in response to a final source-current control signal received thereat,
   a controlled final mirror-current load for providing a final reference current and a final mirror current sharing a common final load-current magnitude, said final mirror-current load having a load-control input so that said final load-current magnitude can be varied in response to a load-control signal received thereat, and
   a final input section for variably coupling said final mirror-current load to said final current source in response to said first and second system input signals, said final input section including a first final control element for controlling access of said final reference current to said final current source in response to said first system input signal, said final input section also including a second final control element for controlling access of said final mirror current to said final current source in response to said second system input signal, said first final control element having a first final-control-element input coupled to said system input means for receiving said first system input signal therefrom, said second control element having a second final-control-element input coupled to said system input means for receiving said second system input therefrom; and
   control means for minimizing the maximum transition time of said system output, said control means being coupled to said system input means for receiving said first and second system inputs therefrom, said control means being coupled to at least one of
   said load control input so as to increase said final load-current magnitude to charge an output capacitance when an increase in output voltage is required to reflect a change in the differential between said first system input signal and said second system input signal, and
   said final-current-source control input so as to increase said final source-current magnitude to discharge output capacitance when a decrease in output voltage is required to to reflect a change in the differential between said first system input signal and said second system input signal.

2. A differential amplifier system as recited in claim 1 wherein said control means is coupled to said load control input and to said final-current-source control input so as to charge said output capacitance when an increase in output voltage is required to reflect a change in the differential between said first system input signal and said second system input signal, and so as to discharge output capacitance when a decrease in output voltage is required to to reflect a change relative change between said first system input signal and said second system input signal.

3. A differential amplifier system as recited in claim 2 wherein said control means includes a front differential amplifier, said front differential amplifier having a front input section coupled to said system input means for receiving said first and second system input signals, therefrom, said front differential amplifier having a first output coupled to said final-current-source control input.

4. A differential amplifier system as recited in claim 3 wherein said control means includes an intermediate differential amplifier, said intermediate differential amplifier having
   an intermediate mirror-current load for providing an intermediate reference current and an intermediate mirror current having a common intermediate load current magnitude,
   an intermediate current source for providing an intermediate source current having an intermediate source-current magnitude,
   an intermediate input section having
      a first intermediate control element for controlling access of said intermediate reference current to said intermediate current source in response to said first system input signal, said first intermediate control element having a first intermediate control input coupled to said system input means for receiving said first system input signal therefrom, and
      a second intermediate control element having a second intermediate control input for controlling access of said intermediate mirror current to said intermediate current source in response to said second system input signal, said second intermediate control element having a said second intermediate control input coupled to said system input means for receiving said second system input signal therefrom,
   said intermediate differential amplifier having an output coupled to said final mirror-current load input for controlling said final mirror current load.

5. A differential amplifier system as recited in claim 4 wherein said front differential amplifier has a second output complementary to said first output, said intermediate current source having an intermediate current-source control input, said second output being coupled to said intermediate current-source control input so as to cause said intermediate source-current magnitude to vary in opposition to said final source-current magnitude.

6. A differential amplifier system for providing a system output signal which varies with a system input difference between a first system input signal and a second system input signal, said system comprising:
   system input means for receiving said first system input signal and said second system input signal;
   a front differential amplifier, said front differential amplifier having
      a front input section coupled to said system input means for receiving said first system input and said second system input signal therefrom, and
      front output means for outputting a first front output signal which varies in opposition to said input difference and a second output signal which varies in concert with said difference, said front output means being coupled to said front input section so that said first and second front output signals are controlled by said first and second system input signals;
   an intermediate differential amplifier having
      intermediate output means for providing an intermediate output signal,
      an intermediate load section having an intermediate reference current load for providing an intermediate reference current, said intermediate load section also having an intermediate mirror-current load for providing an intermediate mirror current, said intermediate mirror current and said intermediate reference current sharing a common intermediate load current magnitude, said intermediate mirror-current load being coupled to said intermediate output means;
      an intermediate current source for providing an intermediate source current, said intermediate current source being coupled to said front output means to receive said second front output signal so that the magnitude of said intermediate source current varies in concert with said system input difference, and
      an intermediate input section for controlling access of said intermediate reference and mirror currents to said intermediate current source in response to said first and second system input signals, said intermediate input section being coupled to said system input means for receiving said first system input signal and said second system input signal therefrom so that said intermediate output signal varies in opposition to said system input difference, said intermediate input section being coupled to said intermediate current source and to said intermediate mirror-current load;
   a final differential amplifier having
      system output means for providing said system output signal,
      a final load section having a final reference current load for providing a final reference current, said intermediate load section also having a final mirror-current load for providing a final mirror current, said final mirror current and said final reference current sharing a common final load current magnitude, said final mirror-current load being coupled to said final output means, said final load section having a final load control input coupled to said intermediate output means so that said final load-current magnitude varies in opposition to said intermediate output signal;
      a final current source for providing a final source current, said final current source being coupled to said front output means so as to receive said first front output signal so that said final source current varies in opposition to said system input difference, and
      a final input section coupled to said system input means for receiving said first system input signal and said second system input signal therefrom so that said system output signal varies in concert with said system input difference;
   whereby,
      when said system input difference changes from a negative value to a positive value, said final mirror load current is increased and said final source current is decreased so that charging of output capacitance is facilitated, promoting more rapid development of a higher output potential, and
      when said system input differential changes from a positive value to a negative value, said final mirror load current is decreased and said final source current is increased so that discharging of output capacitance is facilitated, promoting more rapid development of a lower output potential.

7. A differential amplifier system for providing a system output signal as a function of the difference between a first system input signal with which said output signal is to vary in concert and a second system input signal to which said output signal is to vary in opposition, said system comprising:

a system input means for receiving said system input signals;

a differential transconductance amplifier for providing a first reference current and a second reference current in response to said system input signals so that said first reference current varies in opposition to said difference and so that said second reference current varies in concert with said difference, said differential transconductance amplifier having a front input section coupled to said system input means for receiving said system input signals therefrom;

an intermediate differential amplifier for providing an intermediate output signal in response to said first and second system input signals, said intermediate differential amplifier having an intermediate input section coupled to said system input means for receiving said system input signals therefrom, said intermediate differential amplifier having an intermediate mirror-current load and a controlled intermediate current source;

a final differential amplifier for providing said system output signal, said final differential amplifier having a final input section coupled to said system input means for receiving said system input signals therefrom, said final differential amplifier having a controlled final mirror-current load and a controlled final current source, said final mirror-current load having a load control input coupled to said intermediate differential amplifier for receiving said intermediate output therefrom so that the load currents provided by said final mirror-current load vary in concert with said difference; and current amplifier means for respectively coupling said intermediate current source and said final current source to said differential transconductance amplifier so that the current through said final current source changes in proportion to changes in said first reference current and so that current through said intermediate current source changes in proportion to changes in said second reference current.

8. A differential amplifier system as recited in claim 7 wherein said intermediate source current and said final source current vary by 1.0 to 3.0 times the extent that said first and second reference currents vary.

* * * * *